United States Patent
Filippi et al.

(10) Patent No.: US 8,912,658 B2
(45) Date of Patent: Dec. 16, 2014

(54) INTERCONNECT STRUCTURE WITH ENHANCED RELIABILITY

(75) Inventors: Ronald Filippi, Wappingers Falls, NY (US); Ping-Chuan Wang, Hopewell Junction, NY (US); Griselda Bonilla, Fishkill, NY (US); Kaushik Chanda, Fishkill, NY (US); Robert D. Edwards, Marlboro, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 12/915,510

(22) Filed: Oct. 29, 2010

(65) Prior Publication Data

US 2012/0104610 A1    May 3, 2012

(51) Int. Cl.
| | |
|---|---|
| *H01L 23/48* | (2006.01) |
| *H01L 23/52* | (2006.01) |
| *H01L 29/40* | (2006.01) |
| *H01L 23/532* | (2006.01) |
| *H01L 21/768* | (2006.01) |

(52) U.S. Cl.
CPC .... *H01L 21/76829* (2013.01); *H01L 23/53223* (2013.01); *H01L 23/53266* (2013.01); *H01L 23/53238* (2013.01); *H01L 21/76849* (2013.01)
USPC ................ 257/774; 257/762; 257/E23.145

(58) Field of Classification Search
CPC ................ H01L 23/53238; H01L 23/53266
USPC ..................... 257/762, 774, E23.145, 751
See application file for complete search history.

(56) References Cited

U.S. PATENT DOCUMENTS

| | | | |
|---|---|---|---|
| 6,274,499 B1 | 8/2001 | Gupta et al. | |
| 6,611,060 B1 | 8/2003 | Yano et al. | |
| 6,654,108 B2 | 11/2003 | Ravid et al. | |
| 6,809,029 B2 | 10/2004 | Nogami et al. | |
| 6,893,959 B2 | 5/2005 | Barth | |
| 7,291,558 B2 * | 11/2007 | Geffken et al. | 438/687 |
| 7,514,361 B2 | 4/2009 | Bonilla et al. | |
| 7,589,021 B2 | 9/2009 | Hong | |
| 7,625,815 B2 | 12/2009 | Yang | |
| 7,799,683 B2 * | 9/2010 | Learn et al. | 438/687 |
| 2006/0205204 A1 | 9/2006 | Beck | |
| 2007/0184655 A1 | 8/2007 | Learn et al. | |

(Continued)

OTHER PUBLICATIONS

International Application No. PCT/US2011/056119 Filed: Oct. 13, 2011 International Search Report and the Written Opinion issued Apr. 27, 2012.

(Continued)

*Primary Examiner* — Howard Weiss
(74) *Attorney, Agent, or Firm* — Steven Kellner; Catherine Ikers

(57) ABSTRACT

An improved interconnect structure including a dielectric layer having a conductive feature embedded therein, the conductive feature having a first top surface that is substantially coplanar with a second top surface of the dielectric layer; a metal cap layer located directly on the first top surface, wherein the metal cap layer does not substantially extend onto the second top surface; a first dielectric cap layer located directly on the second top surface, wherein the first dielectric cap layer does not substantially extend onto the first top surface and the first dielectric cap layer is thicker than the metal cap layer; and a second dielectric cap layer on the metal cap layer and the first dielectric cap layer. A method of forming the interconnect structure is also provided.

12 Claims, 4 Drawing Sheets

(56) References Cited

U.S. PATENT DOCUMENTS

| | | |
|---|---|---|
| 2008/0102599 A1 | 5/2008 | Yang |
| 2008/0197499 A1* | 8/2008 | Yang et al. .................. 257/758 |
| 2008/0280432 A1 | 11/2008 | Chang et al. |
| 2008/0315426 A1 | 12/2008 | Yang et al. |
| 2009/0127711 A1 | 5/2009 | Bonilla et al. |
| 2009/0189287 A1 | 7/2009 | Yang et al. |
| 2009/0250815 A1 | 10/2009 | Yang et al. |
| 2010/0219529 A1 | 9/2010 | Morrow et al. |

OTHER PUBLICATIONS

IBM, "Copper Interconnect with TDDB Reliability Enhancement," IP.com, IPCOM000161028D, Dec. 7, 2007, 6 pages.

U.S. Appl. No. 12/887,010—Title "Interconnect Structure With a Planar Interface Between a Selective Conductive Cap and a Dielectric Cap Layer" Inventor(s): Shom Ponoth, et al. Filed Sep. 21, 2010.

* cited by examiner

INTERCONNECT STRUCTURE WITH ENHANCED RELIABILITY

FIELD OF THE INVENTION

The present invention relates to an interconnect structure, and a method of fabricating the same. More particularly, the present invention relates to an interconnect structure having enhanced electromigration (EM) and time dependent dielectric breakdown (TDDB) reliabilities. The present invention also provides a method of forming such an interconnect structure.

BACKGROUND OF THE INVENTION

Semiconductor devices generally include a plurality of circuits which form an integrated circuit fabricated on a semiconductor substrate. To improve the performance of the circuits, low k dielectric materials having a dielectric constant of less than silicon dioxide, such as porous dielectric materials, have been used as inter-layer dielectric (ILD) to further reduce capacitance. Interconnect structures made of metal lines or vias are usually formed in and around the porous dielectric material ILD to connect elements of the circuits. An interconnect structure may consist of multilevel or multilayered schemes, such as, for example, single or dual damascene wiring structures. Within a typical interconnect structure, metal lines run parallel to the semiconductor substrate, while metal vias run perpendicular to the semiconductor substrate.

Electromigration (EM) and time dependent dielectric breakdown (TDDB) are two major reliability concerns for copper (Cu) interconnects. EM is the transport of material caused by the gradual movement of the ions in a conductor due to the momentum transfer between conducting electrons and diffusing metal atoms. TDDB occurs when adjacent interconnects are biased differently over an extended period of time which results in leakage current increase and eventually electrical shorts. Both EM and TDDB decrease the reliability of metal interconnects.

To reduce EM and TDDB of a metal interconnect, a dielectric capping layer is deposited directly on the metal. By atomically bonding to the uppermost surface of the underlying metal, the dielectric capping layer retards EM of the metal interconnect. In order to deposit the dielectric cap layer that atomically adheres to the metal, it is necessary to remove non-metallic materials, e.g., metal oxide of the underlying metal, from the surface of the metal. Typically, a "pre-clean" process such as plasma treatment is required to remove the metal oxide materials on the metal. Such a pre-clean process can cause damage to the dielectric material surrounding the metal in the metal interconnect structure. The damage is even worse when the dielectric material is a low dielectric constant (low-k) material.

Another type of capping layer comprises a metallic capping layer. Compared to the dielectric capping layer, the metallic capping layer typically has better adhesion strength to the underlying metal. The increased adhesion strength results in better EM resistance to the metal interconnect. For example, a Cu interconnect with a Co alloy capping layer has demonstrated a greater than 10 times EM resistance than the Cu interconnect with a standard dielectric capping layer. Despite the improvement in EM resistance, the use of a metallic capping layer tends to leave metallic residues on the surface of the dielectric material between the metal features in the metal interconnect. The presence of the metallic residues hinders the reliability of the metal interconnect.

In view of the above, there is a need for providing a metal interconnect structure having enhanced EM and TDDB reliabilities. There is also a need for providing a method for making such a metal interconnect structure.

SUMMARY OF THE INVENTION

The present invention provides an interconnect structure having a metal cap layer directly on a conductive feature embedded in a dielectric layer and a dielectric cap layer directly on the dielectric layer. The dielectric cap layer is thicker than the metal cap layer and has a bottom surface that is substantially coplanar with a bottom surface of the metal cap layer. The interconnect structure of the present invention provides improved EM and TDDB reliabilities compared to conventional interconnect structures mentioned above. The present invention also provides a method of forming such an interconnect structure.

A first embodiment introduces an interconnect structure. The interconnect structure includes a dielectric layer having a conductive feature embedded therein, the conductive feature having a first top surface that is substantially coplanar with a second top surface of the dielectric layer; a metal cap layer located directly on the first top surface, wherein the metal cap layer does not substantially extend onto the second top surface; a first dielectric cap layer located directly on the second top surface, wherein the first dielectric cap layer does not substantially extend onto the first top surface and the first dielectric cap layer is thicker than the metal cap layer; and a second dielectric cap layer on the metal cap layer and the first dielectric cap layer.

A second embodiment introduces a method for forming an interconnect structure. The method includes providing a dielectric layer having a conductive feature embedded therein, the conductive feature having a first top surface that is substantially coplanar with a second top surface of the dielectric layer; forming a first dielectric cap layer on the dielectric layer; removing a portion of the first dielectric cap layer to expose the first top surface of the conductive feature; forming a metal cap layer selectively on the first top surface of the conductive feature, wherein the metal cap layer is thinner than the first dielectric cap layer and does not substantially extend onto the second top surface; and forming a second dielectric cap layer on the first dielectric cap layer and the metal cap layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
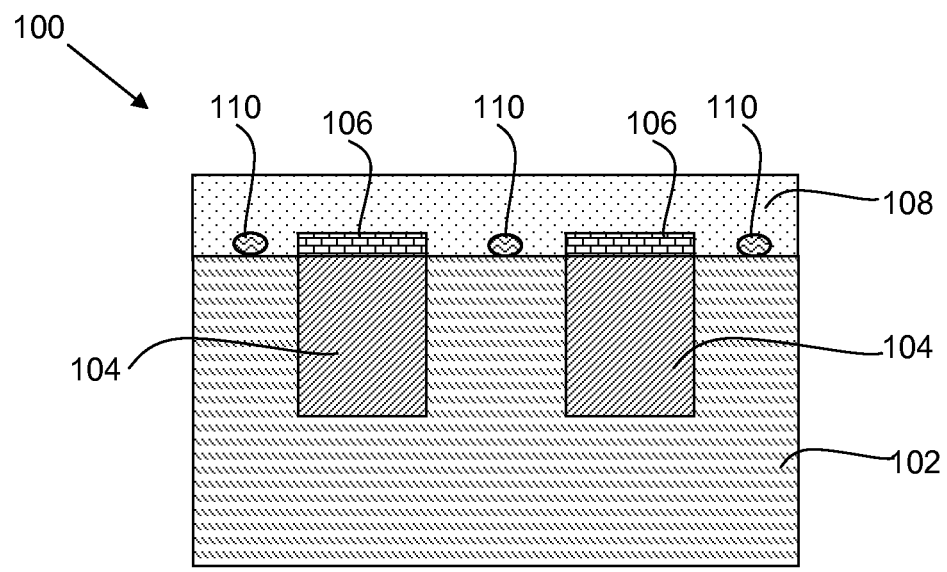
FIG. 1 is a cross-sectional view that illustrates a prior art interconnect structure having a metal cap layer atop a conductive feature in the interconnect structure.

It will be appreciated that for simplicity and clarity of illustration, elements shown in the drawings have not necessarily been drawn to scale. For example, the dimensions of some of the elements may be exaggerated relative to other elements for purpose of clarity.

DETAILED DESCRIPTION OF THE INVENTION

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numerals refer to like features throughout.

It will be understood that when an element, such as a layer, is referred to as being "on" or "over" another element, it can be directly on the other element or intervening elements may also be present. In contrast, when an element is referred to as being "directly on" or "directly over" another element, there are no intervening elements present.

As discussed above, despite the improved EM resistance over a dielectric capping layer, the use of a metal cap layer often causes residual metal on the surface of the dielectric material between the metal features in a metal interconnect structure. The problem in prior art interconnect structure with a metal cap layer is shown in FIG. 1. The interconnect structure 100 in FIG. 1 includes two conductive features 104 embedded in a dielectric layer 102. A metal cap layer 106 is on the conductive features 104. A dielectric cap layer 108 is atop the metal cap layer 106 and the dielectric layer 102. During the metal cap formation process, metal residues 110 are also formed. Some of the metal residues 110 fall between the two conductive features 104 and may cause electrical shorts between the two conductive features 104.

The present invention provides an interconnect structure which can significantly reduce or eliminate electrical shorts between adjacent conductive features due to metal residues from the metal cap formation process. The interconnect structure has a metal cap layer directly on a conductive feature embedded in a dielectric layer and a first dielectric cap layer directly on the dielectric layer. The conductive feature has a first top surface that is substantially coplanar with a second top surface of the dielectric layer. The metal cap layer does not substantially extend onto the second top surface, while the first dielectric cap layer does not substantially extend onto the first top surface. The phrase "does not substantially extend onto" is used in the present invention to denote that no or minimal metal cap material is on the top surface of the dielectric layer. Similarly, no or minimal first dielectric cap material is on the top surface of the conductive feature in the interconnect structure. The first dielectric cap layer is also thicker than the metal cap layer. Thus, even if any residual metal cap material is left on the first dielectric cap layer during the metal cap deposition process, the continuity between adjacent conductive features is broken by the first dielectric cap layer. The word "residual" is used to denote any fragment of the metal cap material that may be formed during the metal cap formation step. This prevents electrical shorts between adjacent conductive features. As a result, the interconnect structure of the present invention provides improved EM and TDDB reliabilities compared to conventional interconnect structures mentioned above.

Figure 2:
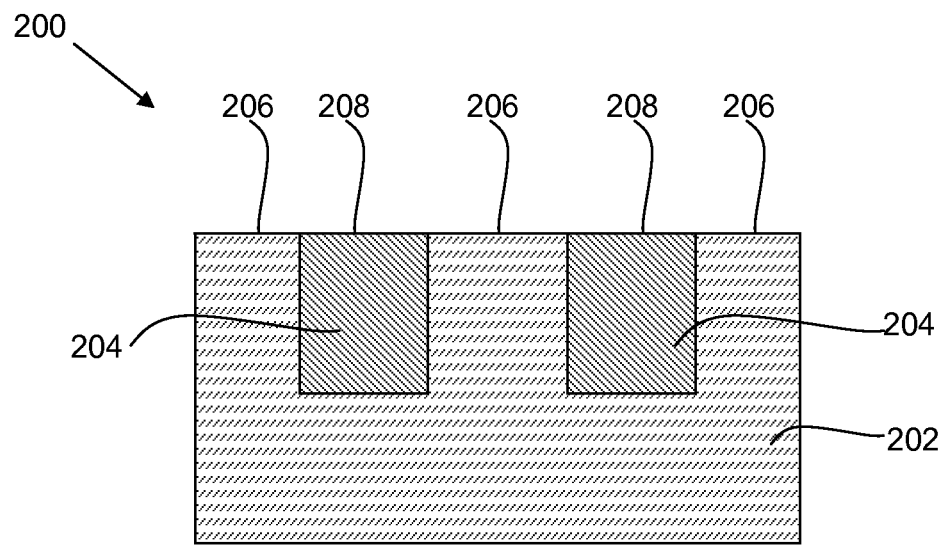
FIGS. 2-8 are cross-sectional views that illustrate the exemplary steps of a method of making an interconnect structure, in accordance with embodiments of the present invention.

Referring to FIG. 2, an initial interconnect structure 200 is provided. The initial interconnect structure 200 includes a dielectric layer 202 and at least one conductive feature 204 embedded in the dielectric layer 202. The initial interconnect structure 200 may be located above a semiconductor substrate (not shown) including one or more semiconductor devices. Optionally, the initial interconnect structure 200 may further include a diffusion barrier layer (not shown) which separates the conductive feature 204 from the dielectric layer 202.

The initial structure 200 maybe made by conventional techniques well known to those skilled in the art. For example, the initial interconnect structure 200 can be formed by first applying the dielectric layer 202 to a surface of a substrate (not shown). The substrate may be a semiconducting material, an insulating material, a conducting material or a combination of two or more of the foregoing materials. When the substrate is comprised of a semiconducting material, a semiconductor material such as Si, SiGe, SiGeC, SiC, Ge alloys, GaAs, InAs, InP or other group III/V or II/VI semiconductor materials may be used. In addition to these listed types of semiconducting materials, the present invention also contemplates cases in which the substrate is a layered semiconductor such as, for example, Si/SiGe, Si/SiC, silicon-on-insulators (SOIs) or silicon germanium-on-insulators (SGOIs). When the substrate is a semiconducting material, one or more semiconductor devices such as, for example, complementary metal oxide semiconductor (CMOS) devices may be fabricated thereon.

When the substrate is an insulating material, the insulating material can be an organic insulator, an inorganic insulator or a combination of an organic insulator and an inorganic insulator. The substrate can be either single layer or multilayers.

When the substrate is a conducting material, the substrate may include, for example, polysilicon, an elemental metal, an alloy of elemental metals, a metal silicide, a metal nitride or a combination of two or more of the foregoing materials. The substrate can be either single layer or multilayers.

The dielectric layer 202 may be any interlevel or intralevel dielectrics including inorganic dielectrics or organic dielectrics. The dielectric layer 202 may be porous or non-porous. Examples of suitable dielectrics that can be used as the dielectric layer 202 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or substituted aryl moieties which are linked together by bonds, fused rings, or inert linking groups such as, for example, oxygen, sulfur, sulfone, sulfoxide, carbonyl and the like.

Preferably, the dielectric layer 202 has a dielectric constant of about 4.0 or less. More preferably, the dielectric layer 202 has a dielectric constant of about 2.8 or less. These dielectrics generally have a lower parasitic crosstalk as compared with dielectric materials that have a dielectric constant higher than 4.0. The dielectric constants mentioned herein are measured in a vacuum.

The thickness of the dielectric layer 202 may vary depending on the dielectric material used as well as the exact number of dielectric films within the initial interconnects structure 200. Typically, and for normal interconnect structures, the dielectric layer 202 has a thickness from about 200 nm to about 450 nm.

The conductive feature 204 may be formed by lithography. For example, a photoresist layer is applied to the surface of the dielectric layer 202. The photoresist layer is exposed to a desired pattern of radiation. The exposed photoresist layer is developed utilizing a conventional resist developer. The patterned photoresist layer is used as an etch mask to transfer the pattern into the dielectric layer 202. The etched region of the dielectric layer 202 is then filled with conductive material to form the conductive feature 204.

The conductive feature 204 includes, but is not limited to, polysilicon, a conductive metal, an alloy of two or more conductive metals, a conductive metal silicide or a combination of two or more of the foregoing materials. Preferably, the conductive feature 204 is a conductive metal such as Cu, Al, W or their alloys. More preferably, the conductive feature 204 is Cu or a Cu alloy (such as AlCu). The conductive material is filled into the etched region of the dielectric layer 202 using a conventional deposition process including, but not limited to, chemical vapor deposition (CVD), plasma enhanced chemical vapor deposition (PECVD), sputtering, chemical solution deposition or plating to form the conductive feature 204. After deposition, a conventional planarization process such as, for example, chemical mechanical polishing (CMP) can be used to provide a structure in which the conductive feature 204 has a top surface 208 that is substantially coplanar with a top surface 206 of the dielectric layer 202.

The conductive feature 204 is preferably separated from the dielectric layer 202 by a diffusion barrier layer (not shown). The diffusion barrier layer may include, but is not limited to, Ta, TaN, Ti, TiN, Ru, RuTaN, RuTa, W, WN or any other material that can serve as a barrier to prevent a conductive material from diffusing into a dielectric material layer. The diffusion barrier layer may be formed by a deposition process such as, for example, atomic layer deposition (ALD), CVD, PECVD, physical vapor deposition (PVD), sputtering, chemical solution deposition, or plating. The diffusion barrier layer may also include a bilayer structure that includes a lower layer of a metallic nitride such as, for example, TaN and an upper metallic layer such as, for example, Ta.

The thickness of the diffusion barrier layer may vary depending on the exact means of the deposition process as well as the material employed. Typically, the diffusion barrier layer has a thickness from about 4 nm to about 40 nm, with a thickness from about 7 nm to about 20 nm being more typical.

Figure 3:
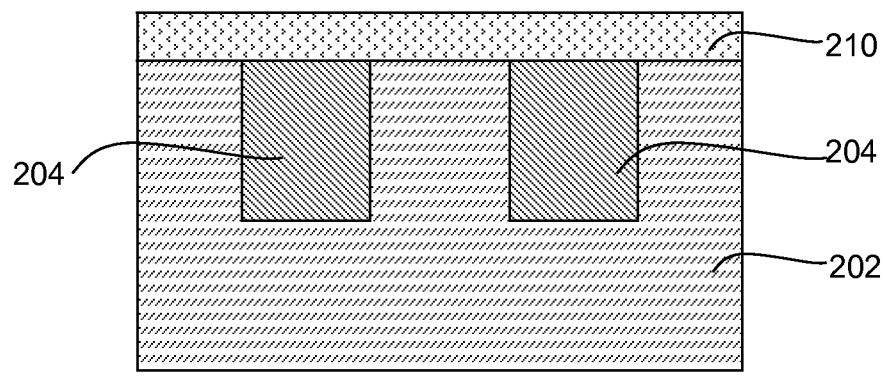

After forming the at least one conductive feature 204 within the dielectric layer 202, a first dielectric cap layer 210 is formed on the initial interconnect structure 200 (FIG. 3). The first dielectric cap layer 210 is formed by a conventional deposition process such as, for example, CVD, PECVD, chemical solution deposition, or evaporation. The first dielectric cap layer 210 may be any suitable dielectric capping material including, but not limited to, SiC, $Si_4NH_3$, $SiO_2$, a carbon doped oxide, a nitrogen and hydrogen doped silicon carbide (SiC(N,H)), or multilayers thereof. The thickness of the first dielectric capping layer 210 may vary depending on the exact means of the deposition process as well as the material employed. Typically, the first dielectric capping layer 210 has a thickness from about 5 nm to about 80 nm, with a thickness from about 10 nm to about 50 nm being more typical.

Figure 4:
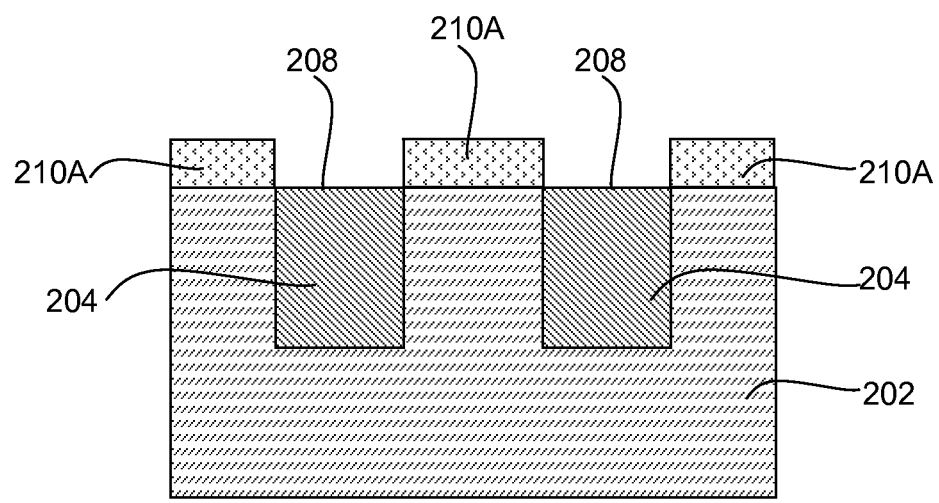

In FIG. 4, a portion of the first dielectric cap layer 210 is removed to expose the top surface 208 of the conductive feature 204. The portion of the first dielectric cap layer 210 can be removed lithographically. For example, a photoresist layer is applied to the surface of the first dielectric cap layer 210. The photoresist layer is exposed to a desired pattern of radiation. The exposed photoresist layer is developed utilizing a conventional resist developer. The patterned photoresist layer is used as an etch mask to remove the portion of the first dielectric cap layer 210. As shown in FIG. 4, after the portion is removed, the remaining first dielectric cap layer 210A does not substantially extend onto the top surface 208 of the conductive feature 204, i.e., no or minimal first dielectric cap material 210 is on the top surface 208 of the conductive feature 204 in the interconnect structure.

Figure 5:
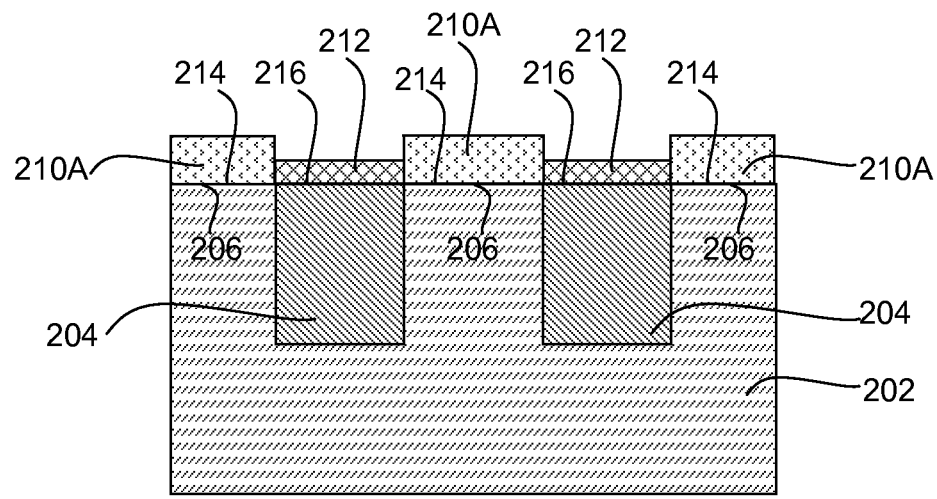

Next, a metal cap layer 212 is formed selectively on the top surface 208 of the conductive feature 204 (FIG. 5). The metal cap layer 212 may be formed by CVD, PECVD, ALD, plasma enhanced atomic layer deposition (PEALD), an electro plating process, or an electroless plating process. The metal cap layer 212 can be any metal suitable for the present invention. Preferably, the metal cap layer 212 is Co, Ru, Ir, Rh, Pt, Ta, W, Mn, Mo, Ni, TaN, Ti, Al or an alloy comprising two or more of the foregoing metals. Typically, the metal cap layer 212 has a thickness from about 1 nm to about 20 nm, with a thickness from about 2 nm to about 10 nm being more typical. As shown in FIG. 5, the metal cap layer 212 does not substantially extend onto the top surface 206 of the dielectric layer 202, i.e., no or minimal metal cap material 212 is on the top surface 206 of the dielectric layer 202 in the interconnect structure.

The metal cap layer 212 is thinner than the first dielectric cap layer 210. Preferably, the metal cap layer 212 has a thickness that is about 50% or less of the thickness of the first dielectric cap layer 210. More preferably, the metal cap layer 212 has a thickness that is about 20% or less of the thickness of the first dielectric cap layer 210. The metal cap layer 212 has a bottom surface 216 that is substantially coplanar with a bottom surface 214 of the remaining first dielectric cap layer 210A.

Figure 6:
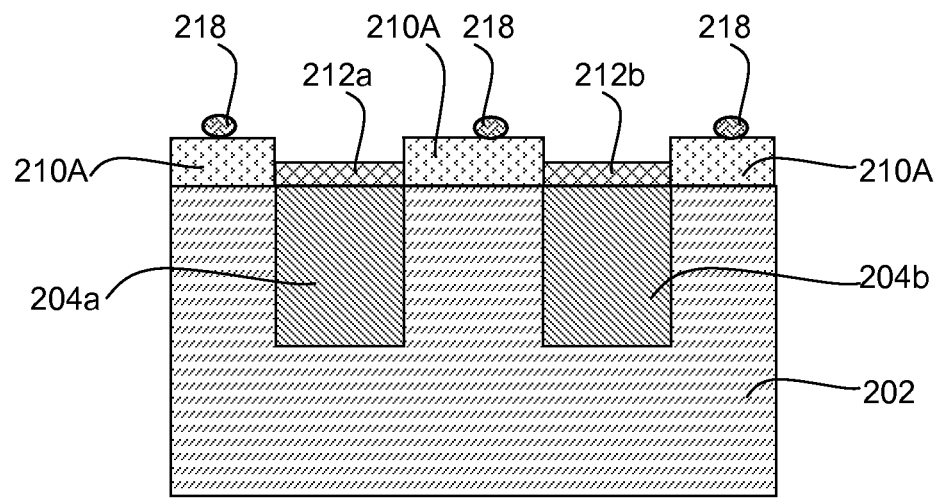

During the formation of the metal cap layer 212, residues 218 of the metal cap material may be formed on the remaining first dielectric cap layer 210A. As shown in FIG. 6, because the first dielectric cap layer 210A is thicker than the metal cap layer 212, the first dielectric cap layer 210A acts as a dielectric barrier between the two adjacent metal caps 212a and 212b. The first dielectric cap layer 210 thus breaks the continuity between the two adjacent conductive features 204a and 204b. This prevents electrical shorts between the two adjacent conductive features 204a and 204b. As a result, the interconnect structure of the present invention provides improved EM and TDDB reliabilities compared to conventional interconnect structures mentioned above.

Optionally, a cleaning step is performed to remove the residue metal cap material 218 to further prevent electrical shorts between the adjacent conductive features. The cleaning step may be a wet cleaning step, a plasma cleaning step, or a touch-up polishing step. The wet cleaning step may use dilute HF or other acids capable of removing metallic oxides. The plasma cleaning step may take the form of a noble-gas-containing or a $H_2$-containing plasma. The touch-up polishing step can be a short-duration chemical mechanical polishing (CMP) step.

Figure 7:
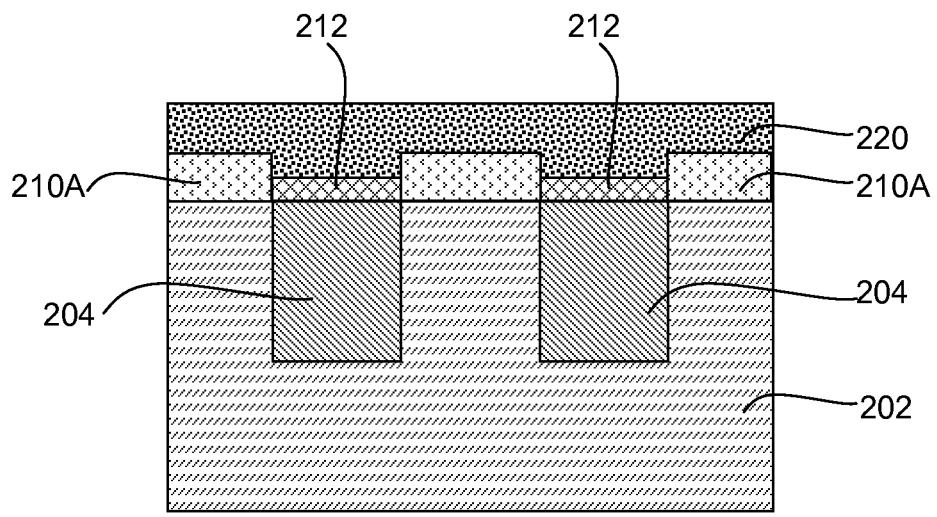

In FIG. 7, a second dielectric cap layer 220 is formed on the remaining first dielectric cap layer 210A and the metal cap layer 212. The second dielectric cap layer 220 may be the same or different material than the first dielectric cap layer 210. Preferably the second dielectric cap layer 220 is the same material as the first dielectric cap layer 210. Examples of suitable materials that can be used as the second dielectric cap layer 220 include, but are not limited to, SiC, $Si_4NH_3$, $SiO_2$, a carbon doped oxide, a nitrogen and hydrogen doped silicon carbide (SiC(N,H)), or multilayers thereof. The second dielectric cap layer 220 may be formed by a conventional deposition process such as, for example, CVD, PECVD, chemical solution deposition, or evaporation. The thickness of the second dielectric cap layer 220 may vary depending on the exact means of the deposition process as well as the material employed. Typically, the second dielectric cap layer 220 has a thickness from about 5 nm to about 80 nm, with a thickness from about 10 nm to about 50 nm being more typical. Preferably, the second cap layer 220 is in direct contact with the metal cap layer 212 and the remaining first dielectric cap layer 210A.

Figure 8:
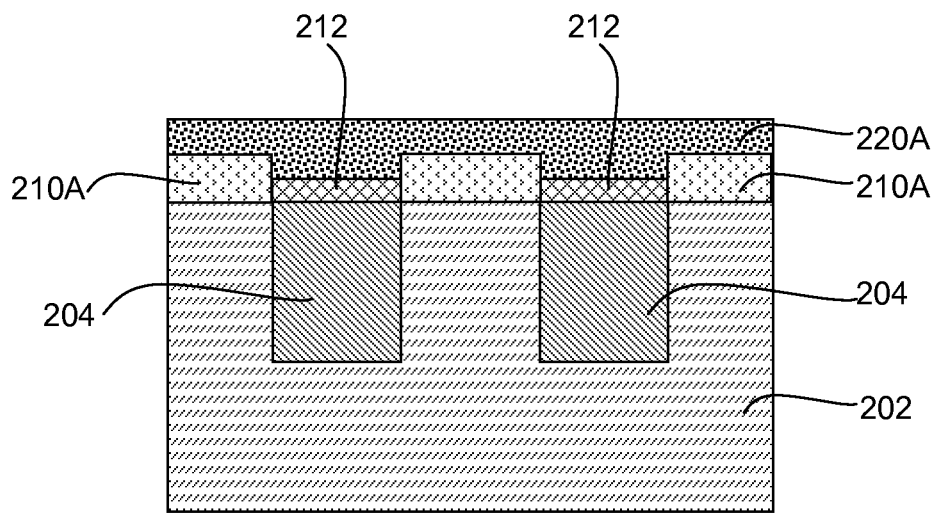

Optionally, the structure shown in FIG. 7 may be subjected to a touch-up polishing step which removes a portion of the second dielectric cap layer 220 and provides the planar interconnect structure shown in FIG. 8. CMP and/or grinding may be used in this step of the present invention.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. An interconnect structure comprising:
   a dielectric layer having a conductive feature embedded therein, said conductive feature having a first top surface that is substantially coplanar with a second top surface of said dielectric layer;
   a metal cap layer located directly on said first top surface, wherein said metal cap layer does not substantially extend onto said second top surface;
   a first dielectric cap layer located directly on said second top surface, wherein said first dielectric cap layer does not substantially extend onto said first top surface and said first dielectric cap layer is thicker than said metal cap layer; and
   a second dielectric cap layer directly on said metal cap layer and directly on said first dielectric cap layer, wherein the metal cap layer consists of: i) a metal or ii) a combination of metals and wherein the metal cap layer has a substantially uniform composition profile.

2. The interconnect structure of claim 1, wherein said first dielectric cap layer has a thickness from about 5 nm to about 80 nm.

3. The interconnect structure of claim 1, wherein said metal cap layer has a thickness from about 1 nm to about 20 nm.

4. The interconnect structure of claim 1, wherein said second dielectric cap layer has a thickness from about 5 nm to about 80 nm.

5. The interconnect structure of claim 1, wherein said second dielectric cap layer is in contact with said metal cap layer and said first dielectric cap layer.

6. The interconnect structure of claim 1, wherein said metal cap layer has a bottom surface that is substantially coplanar with a bottom surface of said first dielectric cap layer.

7. The interconnect structure of claim 1, wherein said metal cap layer is Co, Ru, Ir, Rh, Pt, Ta, W, Mn, Mo, Ni, Ti, Al or an alloy comprising two or more of the foregoing metals.

8. The interconnect structure of claim 1, wherein said first dielectric cap layer is SiN, SiC, Si4NH3, SiO2, a carbon doped oxide, a nitrogen and hydrogen doped silicon carbide (SiC(N,H)) or a combination of two or more of the foregoing materials.

9. The interconnect structure of claim 1, wherein said second dielectric cap layer is SiN, SiC, Si4NH3, SiO2, a carbon doped oxide, a nitrogen and hydrogen doped silicon carbide (SiC(N,H)) or a combination of two or more of the foregoing materials.

10. The interconnect structure of claim 1, wherein said dielectric layer has a dielectric constant of about 4.0 or less.

11. The interconnect structure of claim 1, wherein said conductive feature is Cu, Al, W, Ag, Ti, Ta, or an alloy comprising the aforementioned metals and other elements.

12. An interconnect structure comprising:
    a dielectric layer having a conductive feature embedded therein, said conductive feature having a first top surface that is substantially coplanar with a second top surface of said dielectric layer;
    a metal cap layer located directly on said first top surface, wherein said metal cap layer does not substantially extend onto said second top surface;
    a first dielectric cap layer located directly on said second top surface, wherein said first dielectric cap layer has bottom surface that is substantially flush with a bottom surface of the metal cap layer, wherein the first dielectric cap layer has a substantially uniform composition profile, and wherein said first dielectric cap layer is thicker than said metal cap layer; and
    a second dielectric cap layer directly on said metal cap layer and directly on said first dielectric cap layer, wherein the first dielectric cap layer and the second dielectric layer consist of a material having no elements in common with the metal cap layer.

* * * * *